United States Patent
Hurley et al.

(10) Patent No.: US 11,837,652 B2
(45) Date of Patent: Dec. 5, 2023

(54) SEMICONDUCTOR PROCESSING SYSTEM WITH IN-SITU ELECTRICAL BIAS AND METHODS THEREOF

(71) Applicant: Tokyo Electron Limited, Tokyo (JP)

(72) Inventors: David Hurley, Dublin (IE); Ioan Domsa, Dublin (IE); Ian Colgan, Dublin (IE); Gerhardus Van Der Linde, Dublin (IE); Patrick Hughes, Dublin (IE); Maciej Burel, Dublin (IE); Barry Clarke, Dublin (IE); Mihaela Ioana Popovici, Haasrode (BE); Lars-Ake Ragnarsson, Heverlee (BE)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/662,579

(22) Filed: May 9, 2022

(65) Prior Publication Data
US 2022/0262921 A1    Aug. 18, 2022

Related U.S. Application Data

(62) Division of application No. 16/841,342, filed on Apr. 6, 2020, now Pat. No. 11,335,792.

(51) Int. Cl.
*H01L 29/66*    (2006.01)
*H01L 21/02*    (2006.01)
*H01L 21/67*    (2006.01)

(52) U.S. Cl.
CPC .... *H01L 29/6684* (2013.01); *H01L 21/02532* (2013.01); *H01L 21/02554* (2013.01); *H01L 21/02667* (2013.01); *H01L 21/67098* (2013.01)

(58) Field of Classification Search
CPC ......... H01L 21/67098; H01L 21/67248; H01L 21/67115; H01L 21/67103
See application file for complete search history.

(56) References Cited

U.S. PATENT DOCUMENTS

| | | | |
|---|---|---|---|
| 5,507,639 A | * | 4/1996 | Monoe ............. H01L 21/67098 432/83 |
| 5,635,410 A | | 6/1997 | Kusuda |
| 6,171,934 B1 | | 1/2001 | Joshi et al. |
| | | | (Continued) |

FOREIGN PATENT DOCUMENTS

KR    20130122005 A    11/2013

OTHER PUBLICATIONS

Devi, B.P. et al., "Electrical annealing effect in bulk heterojunction polymer solar cells," Thin Solid Films, vol. 529, 2013, pp. 54-57.
(Continued)

*Primary Examiner* — Julia Slutsker
(74) *Attorney, Agent, or Firm* — Slater Matsil, LLP

(57) ABSTRACT

A method of fabricating a semiconductor device includes placing a semiconductor wafer into a processing chamber, the semiconductor wafer including a first conductive layer and a second conductive layer separated by an intermediate layer; applying an electrical bias voltage across the intermediate layer by coupling the first conductive layer to a first potential and coupling the second conductive layer to a second potential; and annealing the semiconductor wafer while applying the electrical bias voltage.

20 Claims, 5 Drawing Sheets

(56) References Cited

U.S. PATENT DOCUMENTS

| | | | |
|---|---|---|---|
| 6,291,930 B1 | 9/2001 | Sager | |
| 7,374,867 B2 * | 5/2008 | Bristol | G03F 7/38 |
| | | | 430/322 |
| 2002/0154970 A1 * | 10/2002 | Martin | H01L 21/67766 |
| | | | 414/160 |
| 2003/0169553 A1 | 9/2003 | Brown et al. | |
| 2003/0201515 A1 | 10/2003 | Ballantine et al. | |
| 2004/0040662 A1 | 3/2004 | Edamura et al. | |
| 2004/0056321 A1 | 3/2004 | Parsons | |
| 2004/0169992 A1 | 9/2004 | Hunt et al. | |
| 2006/0073683 A1 | 4/2006 | Collins et al. | |
| 2006/0169576 A1 | 8/2006 | Brown et al. | |
| 2011/0092072 A1 * | 4/2011 | Singh | C23C 14/50 |
| | | | 156/345.52 |
| 2016/0357107 A1 * | 12/2016 | Buchberger, Jr. | G03F 7/70866 |
| 2019/0057860 A1 | 2/2019 | Yoon et al. | |
| 2019/0157043 A1 | 5/2019 | Shaw et al. | |
| 2019/0189491 A1 * | 6/2019 | Akatsuka | H01L 21/67103 |
| 2019/0363213 A1 | 11/2019 | Lo et al. | |

OTHER PUBLICATIONS

PCT International Search Report and Written Opinion of the International Searching Authority, PCT/US2020/026904, dated Dec. 29, 2020, 10 pages.

\* cited by examiner

SEMICONDUCTOR PROCESSING SYSTEM WITH IN-SITU ELECTRICAL BIAS AND METHODS THEREOF

CROSS-REFERENCE TO RELATED APPLICATIONS

This application is a divisional application of U.S. application Ser. No. 16/841,342, filed on Apr. 6, 2020, which application is hereby incorporated herein by reference.

TECHNICAL FIELD

The present invention relates generally to semiconductor processing systems and methods, and, in particular embodiments, to a system and method for semiconductor processing with in-situ electrical bias applied directly across conductive layers of a wafer.

BACKGROUND

Generally, semiconductor integrated circuits (IC's) are fabricated by sequentially depositing layers of materials (e.g., dielectric, metal, semiconductor, etc.) over a semiconductor substrate and patterning the layers using photolithography and etch to form circuit components (e.g., transistors and capacitors) and interconnect elements (e.g., lines, contacts, and vias). The minimum feature sizes have been periodically reduced with innovations such as immersion lithography and multiple patterning to reduce cost by increasing packing density. Miniaturization of a component's footprint may be augmented by increasing the component's output per unit area. For example, the transistor drive-current per unit width or the capacitor stored-charge density may be enhanced by using thinner gate dielectric or thinner capacitor dielectric, respectively.

However, the benefits of miniaturization entail some cost in process complexity, circuit speed, and standby power consumption which may need to be addressed. The scaling trend towards narrower linewidth and reduced space between conductors and electrodes has performance tradeoffs. Some of these tradeoffs may be mitigated by using new materials. For example, increased IR drops and RC delays in the interconnect system due to higher line and via resistances and increased line-to-line capacitances may be mitigated by using metals such as ruthenium and cobalt (instead of tungsten and copper) and low-k intermetal dielectric (IMD) such as fluorosilicate glass and carbon-doped oxide. Reduced source-to-drain spacing in transistors and thinner gate dielectric or capacitor dielectric may increase standby leakage. This problem may be mitigated by using a high-k dielectric or a ferroelectric dielectric material.

Incorporation of new materials calls for further innovation to better exploit the advantages provided by their use in IC's.

SUMMARY

In accordance with an embodiment of the present invention, a method of fabricating a semiconductor device includes placing a semiconductor wafer into a processing chamber, the semiconductor wafer including a first conductive layer and a second conductive layer separated by an intermediate layer; applying an electrical bias voltage across the intermediate layer by coupling the first conductive layer to a first potential and coupling the second conductive layer to a second potential; and annealing the semiconductor wafer while applying the electrical bias voltage.

In accordance with an embodiment of the present invention, a system for processing semiconductor wafers includes a processing chamber; a substrate holder configured to support a semiconductor wafer; a heating element configured to heat the semiconductor wafer supported by the substrate holder; a first electrode configured to be detachably attached to a first major surface of a semiconductor wafer; and a first wire coupling the first electrode to a first potential node.

In accordance with an embodiment of the present invention, a system for processing semiconductor wafers includes a processing chamber; a substrate holder configured to support a plurality of semiconductor wafers in the processing chamber; a heating element configured to heat the plurality of semiconductor wafers supported by the substrate holder; a first electrode configured to be detachably attached to a first major surface of a semiconductor wafer; and a first wire coupling the first electrode to a first potential node.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
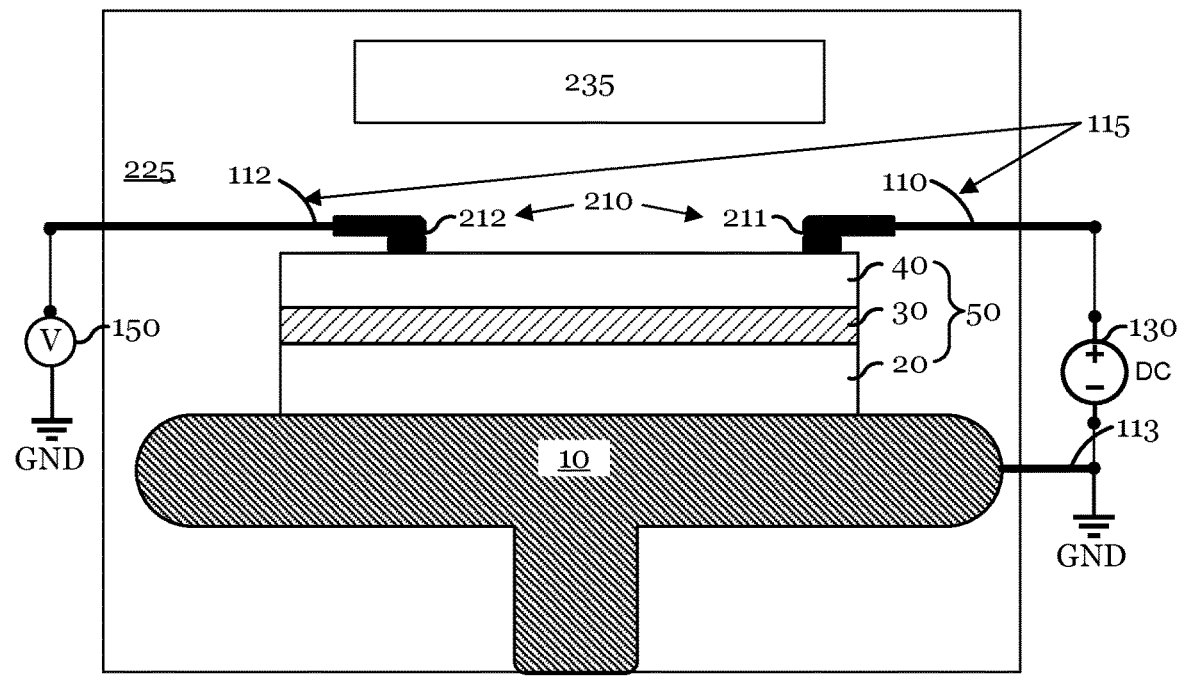
FIG. 1A illustrates a cross-sectional view of a processing chamber of an electric-field annealer, in accordance with an embodiment of the invention.

This disclosure describes equipment and methods for processing semiconductor wafers while an electrical bias voltage is applied across two conductive layers of a wafer during processing. The bias is applied via electrodes in direct electrical contact with the wafer and connected to a power supply located outside the processing chamber. In this document, an anneal process performed concurrently with the electrical bias is referred to as an E-field anneal, and the processing equipment used to perform an E-field anneal is referred to as an E-field annealer. In the example embodiments, the electrical bias is used to subject a dielectric film in the wafer to a DC electric field (E-field) of a desired magnitude during a post-deposition anneal (PDA) process step.

In some fabrication process flows that include fabrication of ferroelectric dielectric based electronic components such as the metal-oxide-semiconductor field-effect transistor (MOSFET) and/or capacitor, it may be advantageous to use an E-field PDA, as explained below. The process steps used to form a ferroelectric layer may comprise depositing a ferroelectric oxide, e.g., doped hafnium oxide, or doped hafnium zirconate, or perovskite oxides such as barium strontium titanate, or bismute. Numerous dopants such as La, Al, Si, Sr, Gd, and Y have shown to improve the ferroelectric behavior by distorting the crystal structure. However, multiple phases are possible in the case of $HfO_2$ or $HfZrO_x$. In these materials, the post-deposition anneal (PDA) conditions play a significant role in inducing the desired non-centrosymmetrical orthorhombic phase with ferroelectric behavior. The PDA step, referred to as the ferroelectric anneal (FEA), may convert the deposited hafnium oxide layer to a stable or metastable polycrystalline ferroelectric hafnium oxide layer. The manufacturing flow of IC's comprising electronic components using hafnium oxide based ferroelectric dielectrics ordinarily include an electrical cycling step, referred to herein as wake-up cycling, to obtain stable ferroelectric properties. In the embodiments in this disclosure, ferroelectric MOSFET's (FE-TEL-FET) and ferroelectric capacitors may be built using, for example, ferroelectric dielectrics comprising, for example, hafnium oxide, wherein, during the crystallizing FEA, the dielectric is subjected to the applied DC E-field mentioned above using equipment and methods described in further detail below. The E-field FEA technique used in the example embodiments may provide an advantage of shortening and, in some embodiments, eliminating the wake-up cycling. The wake-up effect is described in further detail below. It is understood that the E-field FEA technique described using various embodiments of this disclosure may provide similar benefit in forming ferroelectric layers using materials other than hafnium oxide based materials.

Dielectric materials may be polarized by an electric field (E). The electric polarization vector (P) in response to the E-field is generally a function of electric field E that is roughly linear and symmetric for centro-symmetric dielectrics. Centro-symmetric dielectrics are non-ferroelectric (i.e., P=0 at E=0). However, some noncentro-symmetric dielectrics are ferroelectric, that is, they show spontaneous or residual polarization; $P=P_R \neq 0$ at E=0, referred to as remanent polarization ($P_R$). A coercive electric field ($E_C$) of reverse polarity has to be applied to force P to zero in a ferroelectric dielectric. The ferroelectric P vs. E curve is nonlinear, having a roughly symmetric hysteresis loop. As known to people skilled in the art, some ferroelectric films such as hafnium oxide based ferroelectric thin films exhibit a wake-up effect, wherein the pristine film, fabricated using conventional processing (without an E-field anneal), has a pinched hysteresis curve (small $P_R$) that opens up to a stable, wider hysteresis loop (larger $P_R$) after it is cycled through relatively high forward (positive) and reverse (negative) E-fields multiple times, for example, for about $10^2$ cycles to about $10^5$ cycles. Ordinarily, every ferroelectric component comprising a pristine dielectric film with unstable $P_R$ has to be stabilized by wake-up cycling in order for the respective circuit to function as designed. Therefore, it may be recognized that the innovative E-field anneal technique, described in this disclosure, provides a significant advantage by reducing the number of wake-up cycles and, in some embodiments, eliminating the wake-up cycling step.

The existence of hysteresis in its P vs. E characteristic allows a ferroelectric capacitor to be used as a nonvolatile memory (NVM) element. For example, a binary logic state of either "1" or "0" may be stored by forcing the ferroelectric capacitor into either the upper or lower branch of its P vs. E hysteresis loop with a high positive or negative bias voltage, respectively, to a corresponding state of high positive or negative polarization. After the bias is removed (E=0), a portion of the polarization is retained as the remanent polarization, $+P_R$ or $-P_R$, according to whether the ferroelectric capacitor was forced into the upper or lower branch of its P vs. E hysteresis loop. Since the maximum displacement current (corresponding to the maximum slope of P vs. E) in each branch of the hysteresis curve occurs at opposite polarities, the stored information may be retrieved, for example, by sensing the capacitor current in response to a voltage ramp of a given polarity. Because of the criticality of a stable and high $P_R$, as understood from the data storage and retrieval mechanisms explained above, a wake-up cycling step is ordinarily performed in manufacturing IC's comprising hafnium oxide based ferroelectric NVM formed without the E-field FEA mentioned above. However, using the E-field annealer and E-field FEA, described in this disclosure, may provide the advantage of reducing the cost of hafnium oxide based ferroelectric NVM by reducing the number of wake-up cycles and, in some embodiments, eliminating the wake-up cycling step from the manufacturing flow.

Ferroelectrics may be used in forming a gate dielectric stack for FE-FET's. If the remanent polarization of the gate dielectric stack is sufficiently high then, similar to the ferroelectric capacitor, the transistor, once programmed, may retain its state and remain ON or OFF even after the programming voltage is removed. Such an FE-FET may also be used to store digital information in an NVM cell. As explained above in the context of the hafnium oxide based ferroelectric capacitor NVM, the manufacturing cost of hafnium oxide based ferroelectric FE-FET NVM may be reduced by using the innovative E-field annealer and E-field FEA.

An FE-FET may also provide some advantages over a conventional (i.e., non-ferroelectric) MOSFET when used in digital logic or analog circuits. The gate dielectric stack of an FE-FET used in a digital logic and/or an analog circuit comprises ferroelectric and non-ferroelectric thin films. When used in a circuit, for example, when used as a digital switch, the ferroelectric portion of the gate dielectric stack provides a dynamic capacitance which, under certain bias sweep conditions (e.g., sweep rate or frequency), can result in a voltage snap-back due to the change in the polarization of the ferroelectric. This snap-back may result in a desirable steeper subthreshold and a higher $I_{ON}/I_{OFF}$ ratio of the FE-FET. In this context, the FE-FET has been commonly referred to as the negative-capacitance, field-effect transistor (NCFET). Here it is more correctly referred to as steep-slope ferro-electric field-effect transistor (SSFEFET). However, the ferroelectric properties (e.g., $P_R$) and the film thicknesses in the gate dielectric stack may have to be adjusted appropriately in order to achieve hysteresis-free transistor I-V and C-V curves. As known to persons skilled in the art, hysteresis-free I-V and C-V curves implies stable transistor operation whereas, the presence of hysteresis may result in circuit instability and unintended electrical oscillations. It is understood that, from circuit stability considerations, $P_R$ has to remain stable and within a design window in order for the SSFEFET to provide the expected circuit benefits without making the circuit unstable. Accordingly, fabrication flows for SSFEFET's that do not include the E-field FEA might incorporate a wake-up cycling step, while using the inventive E-field anneal technique described in this disclosure may provide the advantage of reducing cost by achieving stable ferroelectric properties with reduced wake-up cycling and, in some embodiments, without wake-up cycling.

Figure 1B:
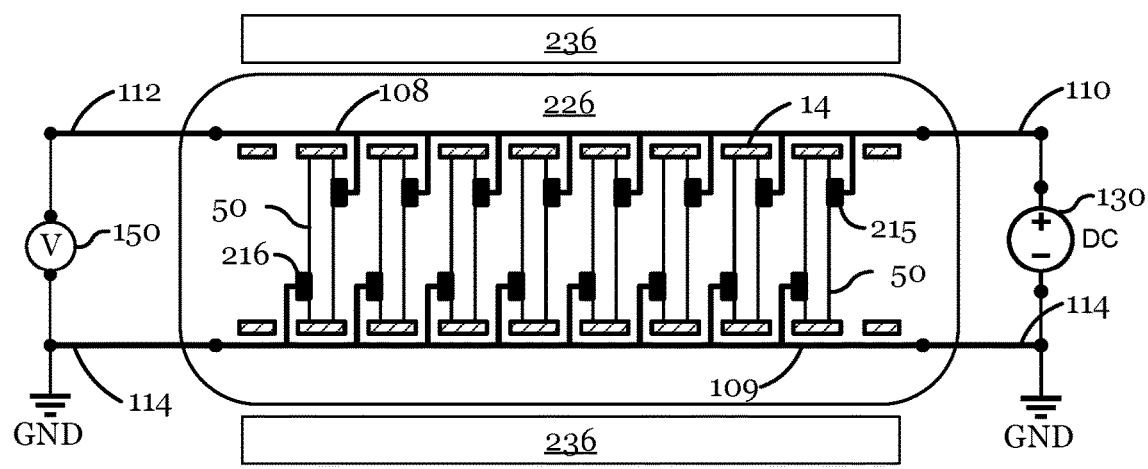
FIG. 1B illustrates a cross-sectional view of a processing chamber of an electric-field annealer, in accordance with an alternative embodiment of the invention.

In this disclosure, first, the E-field anneal technique is described using a schematic illustration of a cross-sectional view of the processing chamber of the E-field annealer during an E-field anneal (e.g., an E-field FEA) process step, as shown in FIG. 1A along with an alternative embodiment in FIG. 1B. The E-field annealer is described further with reference to various perspective views of the load rail of the E-field annealer illustrated in FIGS. 2-5. The electrical connections during the E-field FEA of the gate dielectric layer of FE-FET/SSFEFET's and/or MOS ferroelectric capacitors are described with reference to cross-sectional views of planar bulk complementary MOS (CMOS) and silicon-on-insulator (SOI) CMOS semiconductor wafers illustrated in FIGS. 6A and 6B, respectively. In addition to MOS capacitors, capacitor components in IC's, commonly referred to as MIM capacitors, may be formed using metal layers for both the top and bottom electrodes of the capacitor. In this disclosure, the abbreviations distinguish between non-ferroelectric and ferroelectric insulators; a non-ferroelectric insulator is abbreviated to I and a ferroelectric insulator is abbreviated to F. Electrical connections made to the electrodes of MFM capacitors during the E-field FEA are described with reference to the cross-sectional view illustrated in FIG. 6C.

Stacks of various combinations of material layers may be formed for use in ferroelectric electronic devices (e.g., transistors and capacitors). The stack may comprise ferroelectric layers, along with non-ferroelectric dielectric layers, metal layers, and semiconductors. Examples thereof include, but is not limited to the following stacks (with the layers listed from top-to-bottom): metal-ferroelectric-metal (MFM), metal-ferroelectric-insulator-metal (MFIM), metal-ferroelectric-insulator-semiconductor (MFIS), metal-ferroelectric-metal-semiconductor (MFMS), metal-ferroelectric-metal-insulator-semiconductor (MFMIS), semiconductor-ferroelectric-semiconductor (SFS), and semiconductor-ferroelectric-insulator-semiconductor (SFIS). In this disclosure, the example stacks may be MFIS (e.g., in the FEFET/SSFEFET transistors) or MFM (e.g., in the capacitors with top and bottom metal electrodes).

FIG. 1A schematically illustrates a cross-sectional view of a semiconductor wafer 50 placed on a substrate holder 10 inside a processing chamber 225 of an E-field annealer, which is an annealer equipped to perform an E-field anneal. The processing chamber 225 comprises a heat treatment system 235 designed to heat treat a wafer placed within the processing chamber 225. In various embodiments, the heat treatment system 235 comprises a temperature controller controlling heating and cooling elements to maintain a desired temperature of the semiconductor wafer 50 within the processing chamber 225 by using lamps, resistive elements, and others placed in various locations inside or outside the processing chamber 225.

The semiconductor wafer 50 comprises a semiconductor substrate 20, an MOS-dielectric layer 30 formed over the semiconductor substrate 20, and a conductive top electrode layer 40 formed over the MOS-dielectric layer 30.

As illustrated schematically in FIG. 1A, a first E-field annealer electrode in physical and electrical contact with the conductive top electrode layer 40. The first E-field annealer electrode may comprise a conductive material that is immune to high temperature processing. In one embodiment, the first E-field annealer electrode may comprise tungsten. The first E-field annealer electrode comprises a primary electrode 211 (e.g., tungsten ribbon) that is connected to a first terminal of a DC power supply 130 using a primary wire 110 of a suitable conductor (e.g., tungsten) that may be heated to a high temperature during annealing without being damaged. A ribbon shape of the primary electrode 211 provides a spring-like action that helps prevent slippage and maintain a good physical connection with the surface of the semiconductor wafer 50 as it is heated during the anneal process. The electric potential of the conductive top electrode layer 40 may be optionally monitored using a voltmeter 150 connected by a monitoring wire 112 (similar to the primary wire no) to another monitoring electrode 212, for example, another tungsten ribbon placed in contact with the conductive top electrode layer 40. The two electrodes are electrically shorted together by the conductive top electrode layer 40. The primary electrode 211 and the monitoring electrode 212 may be collectively referred to as the first E-field annealer electrode 210. The primary wire 110 and the monitoring wire 112 may be collectively referred to as the two wires 115.

In the example embodiment illustrated in FIG. 1A, the surface of the substrate holder 10, which is in physical contact with the backside of the semiconductor wafer 50, is used as the second E-field annealer electrode. The surface of the substrate holder 10 may be coated with a suitable conductive material, for example, a silicon-based, carbon-based, silicon and carbon composite-based, or metal nitride-based coating, to obtain a conductive surface suitable for use as an electrode at the annealing temperature. The backside and a portion of the semiconductor wafer 50 adjacent to the backside may be a conductive material such as n-type or p-type doped silicon or germanium, and may be in electrical contact with the surface of the substrate holder 10. In some embodiments, a backside etch may have been used to expose a conductive surface at the backside in order to establish an electrical contact between the backside of the semiconductor wafer 50 and the surface of the substrate holder 10.

As illustrated schematically in FIG. 1A, the surface of the substrate holder 10, hence, the backside of the semiconductor wafer 50 may be connected to a reference potential, referred to as ground and indicated as GND in FIG. 1A. The ground connection may be established using a secondary wire 113 similar to the primary wire 110. In this embodiment, the secondary wire 113 is electrically connected to the grounding wire that connects the conductive parts of the main structure of the equipment to the system ground. The second terminal of the DC power supply 130 is also connected to ground (GND) to apply the bias voltage across the semiconductor wafer 50. As understood by persons skilled in the art, and explained further below, the voltage drop between the two terminals of the DC power supply may be adjusted to achieve an E-field having a desired polarity and E-field strength within a desired range in the MOS-dielectric layer 30. In various embodiments, the DC power supply 130 may be configured to supply a suitable voltage such as between 1 V and 100 V, and between 3 V and 10 V in one embodiment.

Although the embodiment in FIG. 1A illustrates a single semiconductor wafer 50 inside the processing chamber 225, it is understood that multiple wafers, including dummy wafers, may be placed inside a suitably designed processing chamber. The E-field annealer electrodes and electrical connections in FIG. 1A are shown configured for single-wafer processing. However, the E-field annealer configuration may be altered to anneal a batch of semiconductor wafers. An example embodiment suitable for batch processing is illustrated in FIG. 1B.

In FIG. 1B, a plurality of semiconductor wafers 50 are stacked horizontally on a slotted substrate holder 14 comprising an insulator that is immune to high temperature processing (e.g., a ceramic insulator). The insulating material prevents the substrate holder 14 from creating electrical shorts between the conductive top and back sides of the semiconductor wafers 50. The stacked wafers are shown loaded inside a processing chamber 226 of the E-field annealer. Located inside the processing chamber 226 are two conductive buses: a first conductive bus 108 and a second conductive bus 109, secured above and below the slotted substrate holder 14, respectively. The temperature inside the processing chamber 226 may be controlled by a heat treatment system 236.

The conductive top side of each wafer is shown electrically connected to the first conductive bus 108 by a primary electrode 215 that is similar to the primary electrode 211 in FIG. 1A. As illustrated in FIG. 1B, the connections between the first conductive bus 108 and the primary electrodes 215 may be established using connecting wires passing through openings in the slotted substrate holder 14. In this embodiment, the first E-field annealer electrode comprises the primary electrodes 215 and the first conductive bus 108. The first E-field annealer electrode is connected to a DC power supply 130 using the primary wire no, same as in FIG. 1A. The conductive backside of each wafer may be connected to the second conductive bus 109 using secondary electrodes 216 and connecting wires (similar to the top side). In this embodiment, the second E-field annealer electrode, comprising the secondary electrodes 216 and the second conductive bus 109, is connected to GND using a secondary wire 114. The potential of the top side of the wafers may be monitored by connecting the first conductive bus 108 to the voltmeter 150 using a monitoring wire 112, as illustrated in FIG. 113.

The E-field annealer described above with reference to FIG. 1B is suitable for batch processing wafers arranged in a horizontal stack. The design of the horizontal processing chamber 226 may be modified to provide a similar E-field annealer, wherein the semiconductor wafers 50 may be stacked vertically.

Figure 2:
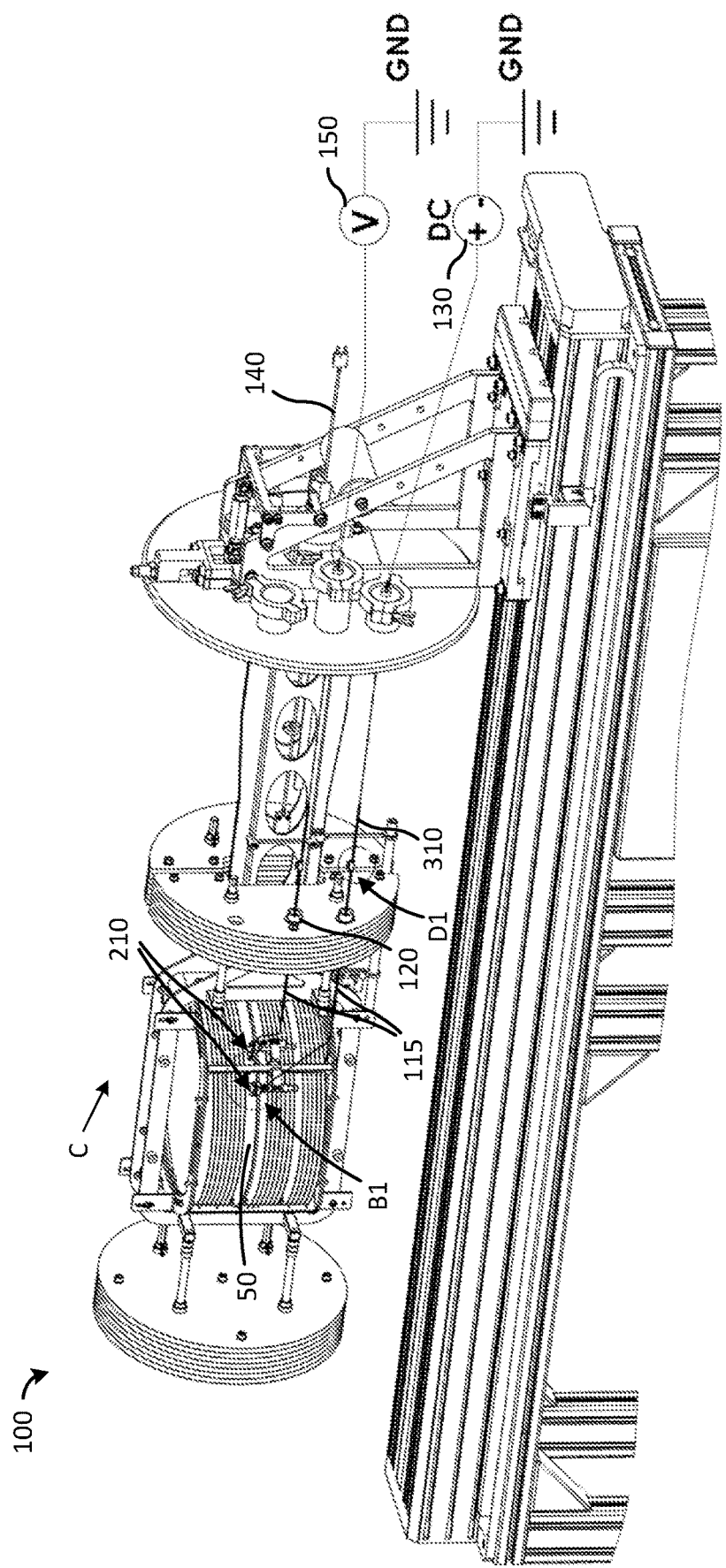
FIG. 2 illustrates a perspective view of a load-rail of an electric-field annealer, in accordance with an embodiment of the invention.

FIG. 2 illustrates a perspective view of a load-rail 100 of an E-field annealer in accordance with an embodiment of the present invention. A load-rail 100 may be used to introduce wafers into the processing chamber 225 of the E-field annealer. The wafers are first loaded into slots in a substrate holder mounted to a load rail stage (FIG. 2). The electrodes are then positioned to make appropriate electrical contacts to the wafer/each wafer. The load rail stage is then used to position the wafers in the substrate holder, into the heating zone of the oven.

Figure 3:
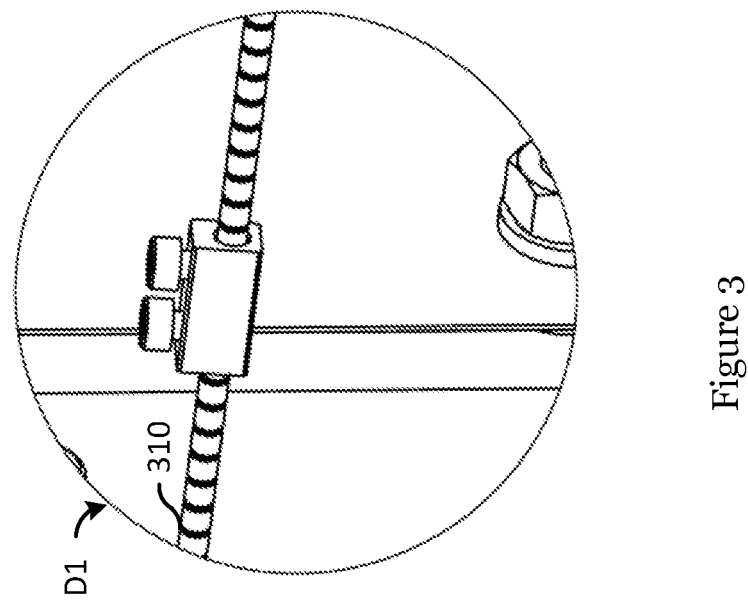
FIG. 3 is a magnified perspective view of a detail of the perspective view illustrated in FIG. 2.

In FIG. 2, two wires 115 (similar to the primary wire no and monitoring wire 112 of FIG. 1A) are shown leading up to a region B1 (indicated by a dashed circle in FIG. 2). Region B1 includes the first E-field annealer electrode 210 comprising two tungsten ribbons touching the conductive top electrode layer 40 of the semiconductor wafer 50. As mentioned above, the ribbon shape helps maintain good physical connection with the semiconductor wafer 50 during the anneal process. The first E-field annealer electrode 210 is attached to portions of the two wires 115 which are exposed metal (e.g., exposed tungsten). Other portions of the two wires 115 are electrically insulated from other conductive parts of the equipment by insulating material, for example, insulating ceramic beads. The insulated portions of the two wires 115 are referred to as insulated conductive wires 310. FIG. 3 illustrates a ceramic-bead insulated conductive wire 310 in a magnified perspective view of the region D1, indicated by a dashed circle in FIG. 2.

The first of the two wires 115 passes through the power feedthrough 120 (shown in FIG. 2) and may be connected to the DC power supply 130 used to provide an E-field in a dielectric layer, for example, the MOS-dielectric layer 30 of the semiconductor wafer 50, as mentioned above. The other wire of the two wires 115 (similar to the monitoring wire 112 of FIG. 1A) may be connected at one end to the first E-field annealer electrode 210, and may be connected at the opposite end to a voltmeter 150 in order to monitor the electric potential of the conductive top electrode layer 40 of the semiconductor wafer 50, as shown schematically in FIG. 2. The conductive parts of the main structure of the equipment, including a substrate holder (e.g., the substrate holder 10 in FIG. 1A) in contact with the backside of the semiconductor wafer 50, are connected to ground GND by a grounding wire 140. The substrate holder for the semiconductor wafer 50 is described further below with reference to FIG. 5A, which illustrates a magnified perspective view of the region B1 (indicated by a dashed circle in FIG. 2).

Figure 4:
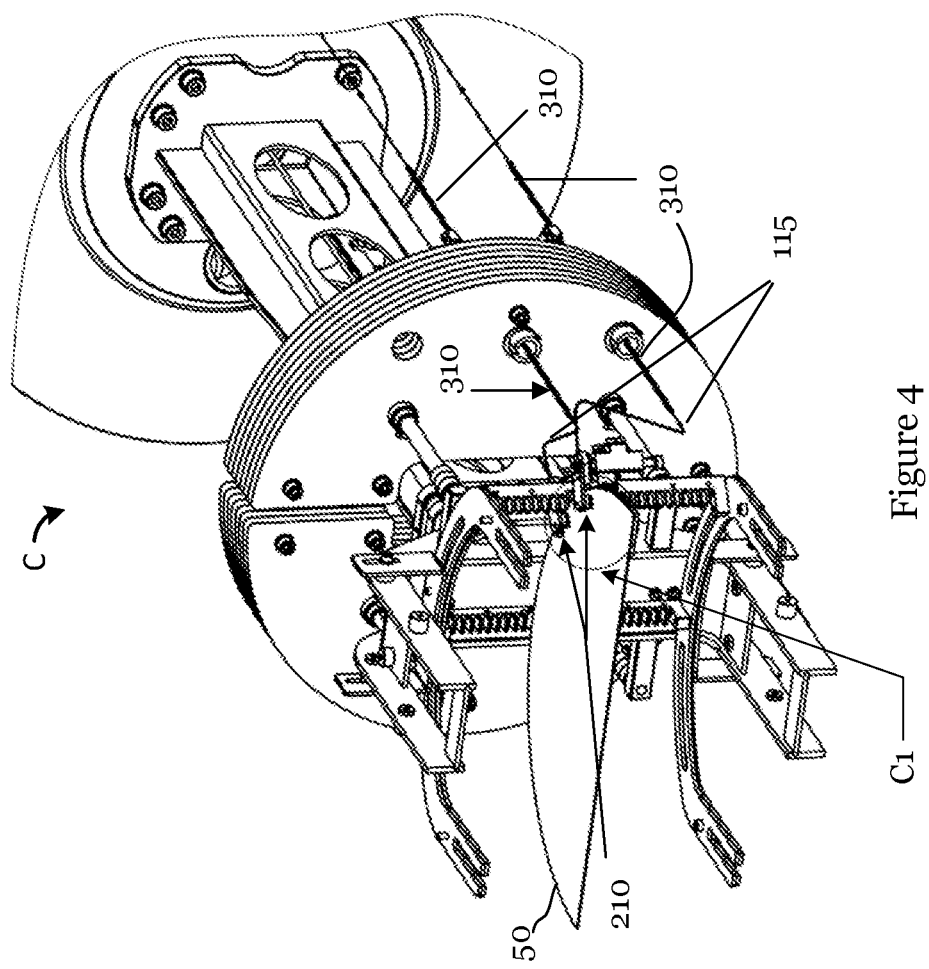
FIG. 4 illustrates a perspective view of a load-rail of an electric-field annealer, in accordance with an embodiment of the invention.

A perspective view of the load-rail wo from a different angle, indicated by an arrow C in FIG. 2, is illustrated in FIG. 4. FIG. 4 shows the conductor of the two wires 115 exposed by removing the ceramic beads from the two respective insulated conductive wires 310 passing through two respective openings. The two wires 115 connect to two tungsten ribbons of the first E-field annealer electrode 210 that are in contact with the top surface of the semiconductor wafer 50. These two wires 115 in FIG. 4 are the same wires that were shown in FIG. 2 running from the first E-field annealer electrode 210 to the DC power supply 130 and the voltmeter 150, respectively. In the perspective view in FIG. 4, the first E-field annealer electrode 210 is located in a region C1 (indicated by a dashed circle). In the perspective view in FIG. 2, the first E-field annealer electrode 210 is located in the region B1.

Figure 5A:
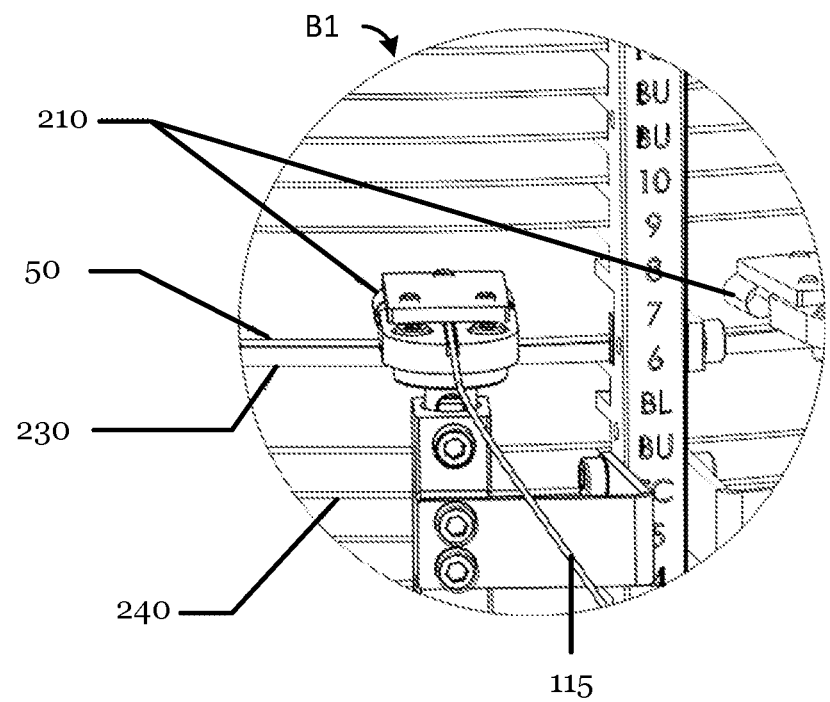
FIG. 5A is a magnified perspective view of a detail of the perspective view illustrated in FIG. 2.
Figure 5B:
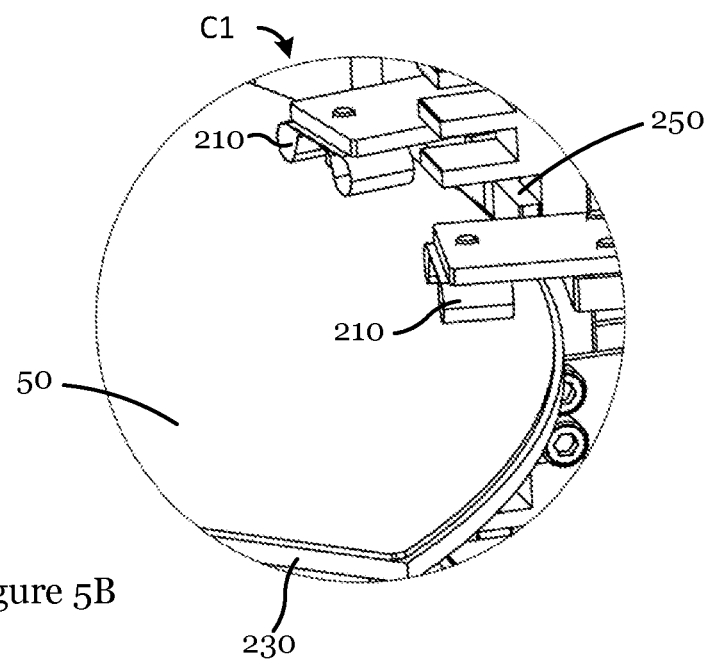
FIG. 5B is a magnified perspective view from a different orientation of a detail of the perspective view illustrated in FIG. 2.

The regions B1 of FIG. 2 and C1 of FIG. 4 are shown in greater detail in the magnified perspective views illustrated in FIGS. 5A and 5B, respectively. The perspective view in FIG. 5A shows the connection between one of the two wires 115 and the first E-field annealer electrode 210 more clearly. The angle from which the perspective view in FIG. 5B is shown provides a clearer illustration of the tungsten ribbons of the first E-field annealer electrode 210 making physical contact with the conductive top electrode layer 40 of the semiconductor wafer 50. The semiconductor wafer 50 in FIGS. 5A and 5B is shown supported from the bottom by a supporting plate 230. The supporting plate 230 is a part of the slotted substrate holder shown in FIGS. 2 and 3, and may also be an example embodiment of the substrate holder 10 of FIG. 1A. The surface of the supporting plate 230 may be metallic, comprising, for example, stainless steel, and may be in physical and electrical contact with a conductive backside of the semiconductor wafer 50. The supporting plate 230 may be in the form of a ring in one embodiment. The ring shape supports the outer diameter of the wafer but exposes a majority of the back side surface to the heating elements. The supporting plate 230 may comprise a conductive material connected to ground GND.

FIG. 5A shows several optional buffer wafers 240 that help achieve a more uniform temperature profile across the surface of the semiconductor wafer 50 during anneal. The buffer wafers 240 are not shown in FIGS. 4 and 5B for clarity. As illustrated in FIG. 5B, insulating ceramic tabs 250 may be placed along carrier rails close to the edges of the semiconductor wafer 50 and the supporting plate 230 to reduce the possibility of accidentally creating undesirable electrical shorts between the semiconductor wafer 50 and the conducting surfaces of the E-field annealer.

The DC bias voltage to which the DC power supply 130 may be set during the E-field PDA generally depends not only on the thickness, $t_{OX}$, of the target dielectric layer for which the E-field PDA is being performed (e.g., the MOS-dielectric layer 30 in FIG. 1A) but also on the properties of other layers such as the materials used in the conductive top electrode layer 40, and the materials, thicknesses, and properties of the layers below the target dielectric layer, as described below. In some embodiments, the DC bias voltage of the DC power supply 130 may be controlled to remain constant during E-field annealing.

Figure 6A:
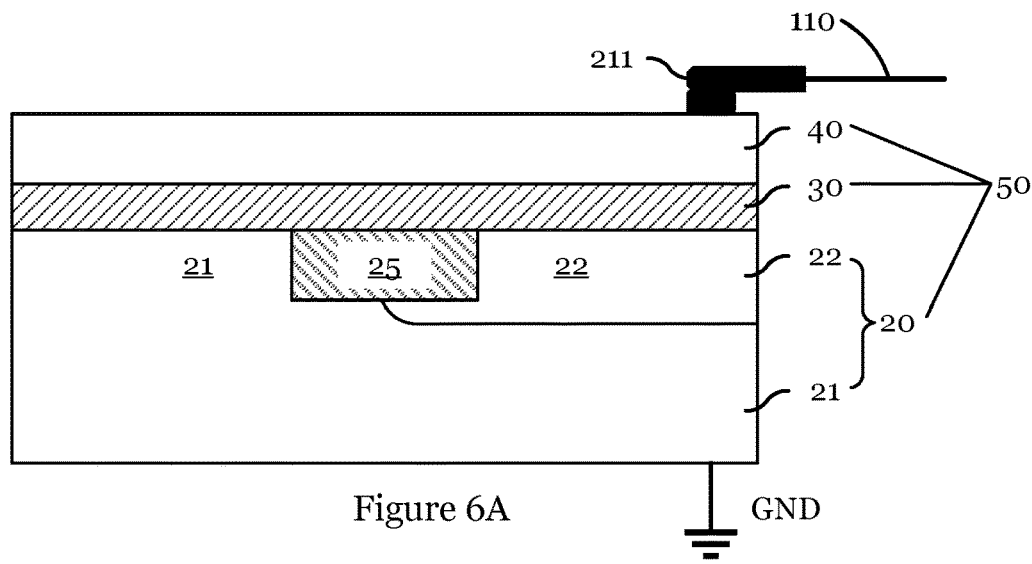
FIGS. 6A-6C illustrate cross-sectional views of various semiconductor wafers placed in a processing chamber of an electric-field annealer, in accordance with an embodiment of the invention.
Figure 6B:
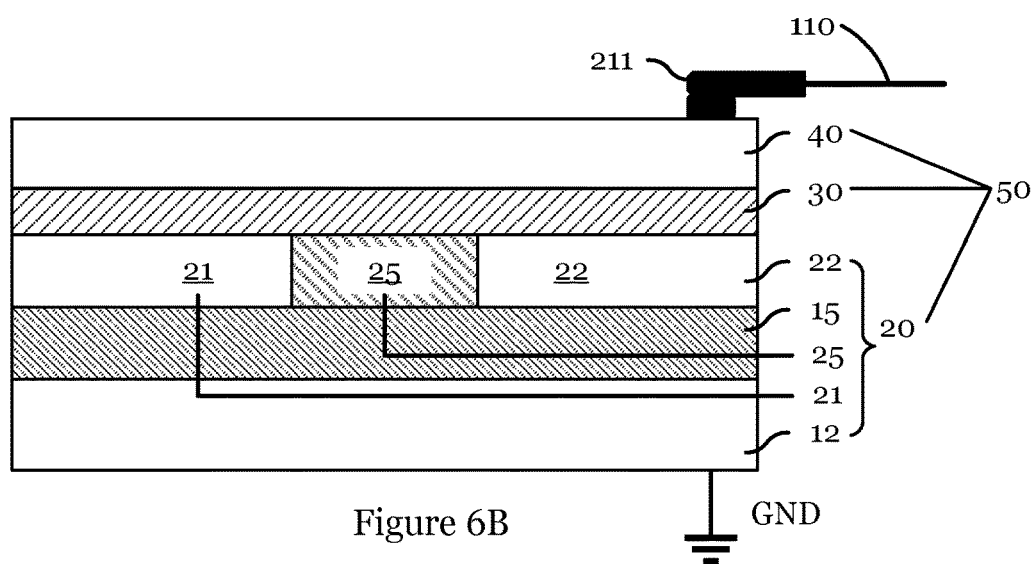

FIGS. 6A and 6B illustrate a cross-sectional view of a semiconductor wafer 50 at an E-field anneal step of a planar bulk CMOS flow and a planar SOI CMOS flow, respectively. The E-field anneal step, in the example embodiments illustrated in FIGS. 6A and 6B, is an E-field ferroelectric anneal, FEA, being performed after the conductive top electrode layer 40 has been formed over the MOS-dielectric layer 30. The conductive top electrode layer 40 may be used as the gate electrode of an FE-FET/SSFEFET or of a ferroelectric MOS-capacitor and may comprise one or more conductive materials such as TiN, TaN, W, metallic alloys, and the like.

In FIGS. 6A and 6B, a gate-first process integration method may be used to fabricate the ferroelectric components (e.g., FE-FET/SSFEFET, and ferroelectric MOS-capacitor) that use the MOS-dielectric layer 30. However, it is understood by persons skilled in the art that the innovative aspects of these embodiments are applicable to the respective ferroelectric components fabricated using a gate-last (or replacement-gate) process integration method.

In the example embodiments illustrated in FIGS. 6A and 6B, the MOS-dielectric layer 30 comprises a doped amorphous hafnium oxide film, and an interfacial dielectric film (e.g., silicon oxide) adjacent to the surface of the semiconductor (e.g., silicon). The thickness $t_{OX}$ of the MOS-dielectric layer 30 depends on the application and may vary from about 1 nm to about 100 nm. The annealing temperature may be adjusted such that, during annealing, the amorphous hafnium oxide would crystallize to form a polycrystalline hafnium oxide film. For example, the E-field FEA may be performed at a temperature of about 200° C. to about 1200° C. in an inert gaseous ambient at, e.g., a low pressure. A temperature lower than 200° C. may be inadequate for crystallizing the amorphous layer, and a temperature higher than 1200° C. may alter the properties of other layers formed during earlier processing steps. The orthorhombic crystal phase of hafnium oxide is ferroelectric, but pure amorphous $HfO_2$ may be naturally converted to monoclinic phase or cubic phase crystalline grains because the orthorhombic phase is unstable in pure $HfO_2$. However, as known to a person skilled in the art, the orthorhombic phase of $HfO_2$ may be stabilized by certain dopant atoms such as zirconium, silicon, or lanthanum atoms. Accordingly, as the doped amorphous hafnium oxide film in the MOS-dielectric layer 30 crystallizes, the orthorhombic phase of $HfO_2$ is formed and may be stabilized by the dopants in a metastable orthorhombic phase that is ferroelectric. The electric field strength during the E-field FEA may be adjusted to be between 1 MV/cm to about 100 MV/cm. While too low an E-field may not provide sufficient benefit in reducing/eliminating wake-up cycling, too high an E-field may damage the MOS-dielectric layer 30 and/or degrade its lifetime. The respective DC bias voltage setting of the DC power supply 130 to provide an E-field in the desired range in the MOS-dielectric layer 30 depends on whether the process flow is for fabrication of bulk CMOS or SOI CMOS, as explained further below.

Figure 6C:
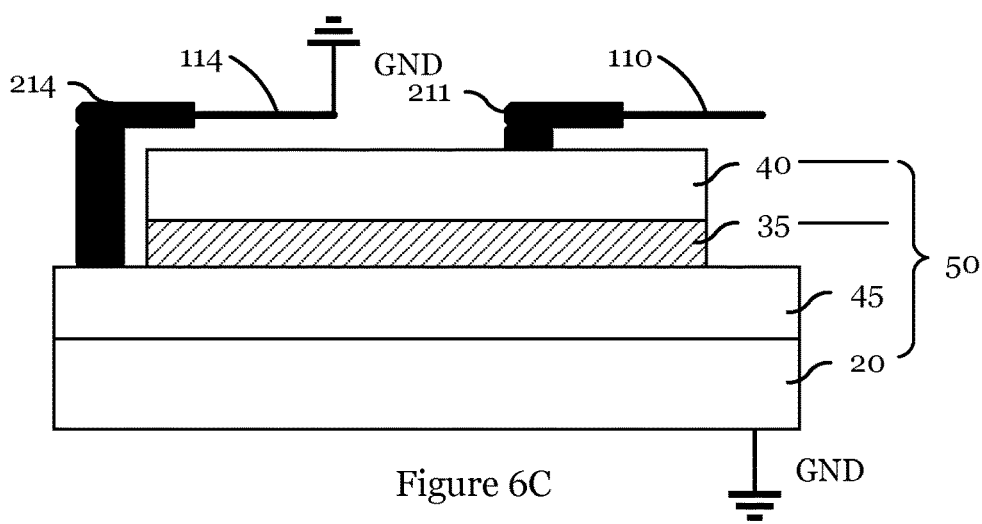

In FIGS. 6A-6C, the layers of the semiconductor wafer 50 over which the layers specific to a ferroelectric component are formed are collectively referred to as substrate 20. Accordingly, for a planar FE-FET/SSFEFET or ferroelectric MOS-capacitor, shown in FIGS. 6A and 6B, substrate 20 comprises all the layers formed prior to forming the MOS-dielectric layer 30. For an MFM ferroelectric capacitor, shown in FIG. 6C, substrate 20 comprises all the layers formed prior to forming an MFM conductive bottom electrode layer 45.

Substrate 20 for a planar FE-FET/SSFEFET or ferroelectric MOS-capacitor comprises a first semiconductor region 21 of the first conductivity type (e.g., p-type), a second semiconductor region 22 of the second conductivity type (e.g., n-type), and an insulating region, referred to as shallow-trench isolation (STI) region 25 that serves to electrically isolate adjacent electronic components in the first and second semiconductor regions 21 and 22, respectively. As known to persons skilled in the art, the conductive top electrode layer 40 over the first semiconductor region 21 and the second semiconductor region 22 may comprise the same materials formed by the same processes, or comprise different materials formed by distinct processes. Various masking steps may be used to mask and expose appropriate regions when using distinct processes.

As illustrated in FIG. 6A, in bulk CMOS, the first semiconductor region 21 of the first conductivity type extends all the way to the backside of the semiconductor wafer 50, and the second semiconductor region 22 of the second conductivity type extends up to a depth to form a p-n junction with the first semiconductor region 21. The p-n junction is generally referred to as the nwell-to-pwell junction. In SOI CMOS, the first semiconductor region 21, the second semiconductor region 22, and the STI region 25 are terminated below by an insulating region referred to as buried-oxide (BOX) layer 15 comprising, for example, silicon oxide, as illustrated in FIG. 6B. Semiconductor wafers with a BOX layer 15 may be produced using several methods such as the Separation by Implantation of Oxygen (SIMOX) process, wafer bonding processes, for example, the Smart Cut technique, and the like, as is known to persons skilled in the art. A doped semiconductor region 12 below the BOX layer 15 extends all the way to the backside of the semiconductor wafer 50.

The backside of the semiconductor wafer 50 and the second terminal of the DC power supply 130 are connected to ground GND, and the first terminal of the DC power supply is connected to the primary electrode 211 of the first E-field annealer electrode using the primary wire 110, as described above with reference to FIGS. 1A and 2. (For simplicity, the monitoring electrode 212 and the monitoring wire 112 are not shown in FIGS. 6A-6C.) The primary electrodes 211, shown in FIGS. 6A and 6B, are in physical and electrical contact with the conductive top electrode layer 40, similar to the cross-sectional view in FIG. 1A and the detailed perspective views in FIGS. 5A and 5B. Accordingly, the total DC bias voltage supplied by the DC power supply 130 gets applied across the conductive top electrode layer 40 and the backside of the semiconductor wafer 50.

Referring again to FIG. 6A, in bulk CMOS, in the first semiconductor region 21, the electric potential at the semiconductor side of the MOS-dielectric layer 30 is about the same as that of the backside of the semiconductor wafer 50. Accordingly, the voltage drop across the MOS-dielectric layer 30 is determined by the DC bias voltage sourced by the DC power supply 130 and the work function difference between the first semiconductor region 21 and the conductive top electrode layer 40 above this region. However, in the second semiconductor region 22, the voltage drop across the nwell-to-pwell junction has to be included in determining the electric potential at the semiconductor side of MOS-dielectric layer 30, hence in determining the voltage drop across the MOS-dielectric layer 30. Accordingly, it may be advantageous to minimize the voltage drop across the nwell-to-pwell junction by selecting the polarity of the DC bias voltage sourced by the DC power supply 130 such that the p-n junction gets forward-biased. In one embodiment, the DC bias voltage setting for the DC power supply 130 during the E-field FEA may be about 3 V to about 10 V for a $t_{OX}$ value of about 10 nm for the MOS-dielectric layer 30.

Referring to FIG. 6B, in SOI CMOS, a substantial fraction of the DC bias voltage supplied by the DC power supply 130 may drop across the BOX layer 15, depending on the ratio of the thicknesses and the ratio of the dielectric constants of the MOS-dielectric layer 30 and the BOX layer 15. Accordingly, the DC bias voltages used for the E-field FEA in SOI CMOS process flows may have to be increased relative to the corresponding values in bulk CMOS process flows.

The relatively advanced CMOS IC's may use a three-dimensional MOS structure, referred to as a FinFET structure, wherein generally the gate and gate dielectric wraps around three sides of thin and long semiconductor fins protruding from a semiconductor substrate. The electrical connections to FE-FET/SSFEFET and MOS ferroelectric capacitors during the E-field FEA described with reference to planar MOS structures illustrated in FIGS. 6A and 6B may be adapted by a person skilled in the art to perform E-field FEA of respective FinFET structures.

FIG. 6C illustrates an E-field FEA step being performed in a process flow that includes fabrication of MFM ferroelectric capacitors. The MFM ferroelectric capacitor structure in FIG. 6C comprises a doped hafnium oxide based ferroelectric-dielectric layer 35 sandwiched between the conductive top electrode layer 40 and a conductive bottom electrode layer 45. The primary electrode 211, shown making contact with the conductive top electrode layer 40, is connected to the first terminal of the DC power supply 130 (not shown) using the primary wire 110. The backside of the semiconductor wafer 50 and the second terminal of the DC power supply 130 are connected to GND, same as for the semiconductor wafers 50 in FIGS. 6A and 6B. However, these connections alone may not be sufficient to generate an adequately high E-field in the ferroelectric-dielectric layer 35 of the MFM capacitor if the conductive bottom electrode layer 45 becomes effectively electrically isolated from the backside GND connection of the semiconductor wafer 50 in FIG. 6C by an excessively high cumulative thickness of the dielectric layers in the substrate 20, as explained below.

The MFM capacitor layers, which include the conductive bottom electrode layer 45, are generally formed during the back-end-of-line (BEOL) of the IC fabrication flow. Since substrate 20 in FIG. 6C comprises all the layers formed below the conductive bottom electrode layer 45, it may include relatively thick interlayer dielectric (ILD) and inter-metal dielectric (IMD) layers physically located above the conductive semiconductor and gate layers of the MOS-FET's. Accordingly, unless the conductive bottom electrode layer 45 is connected by vias and contacts to the conductive semiconductor and gate layers of the MOSFET's at the intermediate stage of fabrication illustrated in FIG. 6C, the electrical coupling between the backside of the semiconductor wafer 50 and the conductive bottom electrode layer 45 may be too weak to generate an adequately high E-field in the ferroelectric-dielectric layer 35 of the MFM capacitor. In such embodiments, the substrate holder in electrical contact with the backside of semiconductor wafer 50, for example, the substrate holder 10 in FIG. 1A or the supporting plate 230 in FIG. 5A may not be an effective second E-field annealer electrode. In such instances, additional processing may be used to create an effective second E-field annealer electrode connection, as described below with reference to FIG. 6C.

In an IC design where the conductive bottom electrode layer 45 is electrically decoupled from the backside of the semiconductor wafer 50 at the intermediate stage of the process flow where the E-field FEA is desired, a masking step may be used to pattern the ferroelectric-dielectric layer 35 of the MFM capacitor and the conductive top electrode layer 40 to expose a portion of the conductive bottom electrode layer 45, as illustrated in FIG. 6C. The exposed region of the conductive bottom electrode layer 45 may be, for example, in the shape of a ring along the edge of the semiconductor wafer 50. An additional secondary electrode 214 (similar in structure to the electrodes of the first E-field annealer electrode 210 shown in the cross-sectional view in FIG. 1A and the detailed perspective views in FIGS. 5A and 5B) may be placed in physical and electrical contact with the exposed portion of the conductive bottom electrode layer 45. The secondary electrode 214 being a direct electrical connection to the conductive bottom electrode layer 45 may be an effective second E-field annealer electrode connection. As illustrated in FIG. 6C, the additional secondary electrode 214 may be connected to GND using a secondary wire 114 (similar to the primary wire 110). Accordingly, the entire DC bias voltage drops across the ferroelectric-dielectric layer 35 of the MFM capacitor. In one embodiment, the DC bias voltage setting for the DC power supply 130 during the E-field FEA may be about 3 V to about 10 V for a $t_{OX}$ value of about 10 nm for the ferroelectric-dielectric layer 35 of the MFM capacitor.

Example embodiments of the invention are summarized here. Other embodiments can also be understood from the entirety of the specification as well as the claims filed herein.

Example 1. A method of fabricating a semiconductor device, the method including: placing a semiconductor wafer into a processing chamber, the semiconductor wafer including a first conductive layer and a second conductive layer separated by an intermediate layer; applying an electrical bias voltage across the intermediate layer by coupling the first conductive layer to a first potential and coupling the second conductive layer to a second potential; and annealing the semiconductor wafer while applying the electrical bias voltage.

Example 2. The method of example 1, further including: decoupling the first conductive layer from the first potential and decoupling the second conductive layer from the second potential; and forming another layer over the first conductive layer.

Example 3. The method of one of examples 1 or 2, where coupling the first conductive layer includes attaching a first electrode to a first major surface of the semiconductor wafer; and where coupling the second conductive layer includes placing a second major surface of the semiconductor wafer on a substrate holder and coupling the substrate holder to the second potential.

Example 4. The method of one of examples 1 to 3, where coupling the first conductive layer includes attaching a first electrode to a first major surface of the semiconductor wafer; and where coupling the second conductive layer includes attaching a second electrode to a second major surface of the semiconductor wafer.

Example 5. The method of one of examples 1 to 4, where coupling the second conductive includes capacitively coupling the second conductive layer to the second potential.

Example 6. The method of one of examples 1 to 5, where the second conductive layer is coupled through a buried oxide layer or through a p-n junction.

Example 7. The method of one of examples 1 to 6, where annealing the semiconductor wafer includes heating the wafer to a temperature between 200° C. and 600° C.

Example 8. The method of one of examples 1 to 7, where applying the electrical bias voltage includes maintaining a potential difference between the first potential and the second potential to be between 1V and 100 V.

Example 9. The method of one of examples 1 to 8, further including monitoring a potential of the first conductive layer by coupling the first conductive layer to a voltmeter.

Example 10. The method of one of examples 1 to 9, where the second conductive layer includes a doped silicon layer.

Example 11. The method of one of examples 1 to 10, further including: before placing the semiconductor wafer into the processing chamber, etching a back side of the semiconductor wafer to expose the doped silicon layer.

Example 12. A system for processing semiconductor wafers, the system including: a processing chamber; a substrate holder configured to support a semiconductor wafer; a heating element configured to heat the semiconductor wafer supported by the substrate holder; a first electrode configured to be detachably attached to a first major surface of a semiconductor wafer; and a first wire coupling the first electrode to a first potential node.

Example 13. The system of example 12, further including: a second electrode coupled to the substrate holder; and a second wire coupling the second electrode to a second potential node.

Example 14. The system of one of examples 12 or 13, further including: a third electrode configured to be detachably attached to the first major surface of the semiconductor wafer; a voltage monitoring meter; and a third wire coupling the third electrode to a voltage monitoring meter.

Example 15. The system of one of examples 12 to 14, further including: a second electrode configured to be detachably attached to a second major surface of the semiconductor wafer; and a second wire coupling the second electrode to a second potential node.

Example 16. The system of one of examples 12 to 15, further including: a power supply coupled to the first potential node.

Example 17. The system of one of examples 12 to 16, further including: a load-rail configured to detachably attach the first electrode to the first major surface of the semiconductor wafer and load the semiconductor wafer into the processing chamber.

Example 18. The system of one of examples 12 to 17, where the first electrode includes a tungsten ribbon and the first wire includes a tungsten wire.

Example 19. A system for processing semiconductor wafers, the system including: a processing chamber; a substrate holder configured to support a plurality of semiconductor wafers in the processing chamber; a heating element configured to heat the plurality of semiconductor wafers supported by the substrate holder; a first electrode configured to be detachably attached to a first major surface of a semiconductor wafer; and a first wire coupling the first electrode to a first potential node.

Example 20. The system of example 19, further including: a first bus including a first plurality of electrodes to contact a first side of each of the plurality of semiconductor wafers; and a second bus including a second plurality of electrodes to contact a second side of each of the plurality of semiconductor wafers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system for processing semiconductor wafers, the system comprising:
   a processing chamber;
   a substrate holder configured to support a semiconductor wafer;
   a heating element configured to heat the semiconductor wafer supported by the substrate holder;
   a first electrode configured to be detachably attached to a first major surface of the semiconductor wafer;
   a first wire coupling the first electrode to a first potential node; and
   a load-rail configured to detachably attach the first electrode to the first major surface of the semiconductor wafer and load the semiconductor wafer into the processing chamber.

2. The system of claim 1, further comprising:
   a second electrode coupled to the substrate holder; and
   a second wire coupling the second electrode to a second potential node.

3. The system of claim 2, further comprising:
   a third electrode configured to be detachably attached to the first major surface of the semiconductor wafer;
   a voltage monitoring meter; and
   a third wire coupling the third electrode to the voltage monitoring meter.

4. The system of claim 1, further comprising:
   a second electrode configured to be detachably attached to a second major surface of the semiconductor wafer; and
   a second wire coupling the second electrode to a second potential node.

5. The system of claim 1, further comprising:
   a power supply coupled to the first potential node.

6. The system of claim 1, wherein the first electrode comprises a tungsten ribbon and the first wire comprises a tungsten wire.

7. A system for processing semiconductor wafers, the system comprising:
   a processing chamber;
   a substrate holder configured to support a plurality of semiconductor wafers in the processing chamber;
   a heating element configured to heat the plurality of semiconductor wafers supported by the substrate holder;
   a first electrode configured to be detachably attached to a first major surface of a semiconductor wafer of the plurality of semiconductor wafers;
   a first wire coupling the first electrode to a first potential node;

a first bus comprising a first plurality of electrodes configured to contact a first side of each of the plurality of semiconductor wafers; and a second bus comprising a second plurality of electrodes configured to contact a second side of each of the plurality of semiconductor wafers.

8. The system of claim 7, wherein the heating element is placed inside the processing chamber.

9. The system of claim 7, wherein the heating element is placed outside the processing chamber.

10. The system of claim 7, wherein the substrate holder comprises a plurality of slots for holding the plurality of semiconductor wafers horizontally over each other.

11. The system of claim 7, wherein the substrate holder comprises a supporting plate configured to support the plurality of semiconductor wafers.

12. The system of claim 11, wherein the supporting plate comprises a conductive material configured to be coupled to a reference potential node.

13. The system of claim 11, wherein the supporting plate comprises a ring shape.

14. The system of claim 7, further comprising a load rail stage configured to position the plurality of semiconductor wafers in the substrate holder, and into a heating zone of the processing chamber.

15. A system for processing semiconductor wafers, the system comprising:

a processing chamber;

a substrate holder configured to support a plurality of semiconductor wafers in the processing chamber;

a heating element configured to heat the plurality of semiconductor wafers supported by the substrate holder;

a first bus comprising a first plurality of electrodes coupled to a first potential node and configured to be detachably attached to a first major surface of each of the plurality of semiconductor wafers;

a second bus comprising a second plurality of electrodes coupled to a second potential node and configured to be detachably attached to a second major surface of each of the plurality of semiconductor wafers; and a load rail stage configured to position the plurality of semiconductor wafers in the substrate holder into a heating zone of the processing chamber.

16. The system of claim 15, wherein the heating element is placed inside the processing chamber.

17. The system of claim 15, wherein the heating element is placed outside the processing chamber.

18. The system of claim 15, wherein the substrate holder comprises a plurality of slots for holding the plurality of semiconductor wafers horizontally over each other.

19. The system of claim 15, wherein the substrate holder comprises a supporting plate configured to support the plurality of semiconductor wafers, the supporting plate comprising a ring shape.

20. The system of claim 15, further comprising:

a voltage monitoring meter coupled to the first bus.

* * * * *